United States Patent [19]

Lee et al.

[11] Patent Number: 5,218,572
[45] Date of Patent: Jun. 8, 1993

[54] SEMICONDUCTOR MEMORY DEVICE

[75] Inventors: Jeon-hyoung Lee, Seoul; Boo-yung Huh, Suwon, both of Rep. of Korea

[73] Assignee: Samsung Electronics Co., Ltd., Kyunggi, Rep. of Korea

[21] Appl. No.: 757,317

[22] Filed: Sep. 10, 1991

[30] Foreign Application Priority Data

Jun. 14, 1991 [KR] Rep. of Korea .................. 91-9839

[51] Int. Cl.$^5$ .............................................. G11C 13/00
[52] U.S. Cl. ................................. 365/200; 365/210
[58] Field of Search .................. 365/210, 200, 189.01, 365/230.01

[56] References Cited

U.S. PATENT DOCUMENTS 5,043,943 8/1991 Crisp et al. ........................ 365/200

Primary Examiner—Terrell W. Fears
Attorney, Agent, or Firm—Rothwell, Figg, Ernst & Kurz

[57] ABSTRACT

A semiconductor memory device comprises a plurality of normal memory cell arrays having a first and a second data state, a plurality of redundant memory cell arrays having a first and a second data state for substituting for the normal memory cell arrays, a plurality of input/output lines, a plurality of complementary input/output lines, a plurality of first control signals for substituting a redundant memory cell array having the first data state for a defective normal memory cell array having the first data state, and a plurality of second control signals for substituting a redundant memory cell array having the second data state for a defective normal memory cell array having the second data state. In the device, a control circuit for transmitting the complementary input/output data to the plurality of input/output lines, and the input/output data to the plurality of complementary input/output data lines according to the circumstances is provided. Accordingly, the yield of semiconductor memory devices can be improved by increasing the potential number of redundant memory cells which can be substituted for defective normal memory cells.

16 Claims, 4 Drawing Sheets

SEMICONDUCTOR MEMORY DEVICE

BACKGROUND OF THE INVENTION

The present invention relates to a semiconductor memory device, and more particularly to a circuit for substituting for a defective memory cell of a semiconductor memory device with a redundancy cell.

Generally, a semiconductor memory device has a plurality of memory cells arranged in rows and columns, and as memory capacity increases, more such memory cells are added. Increasing memory capacity increases the probability of defective memory cells being present, and even if just one memory cell is defective, the entire chip cannot be used. In view of this, an inevitable fact follows: as the memory capacity becomes large, the yield of manufactured semiconductor memory devices deteriorates.

Accordingly, in order to raise the yield of manufactured semiconductor memory devices, rows and columns of a redundancy cell array are arranged as part of a standard memory cell array, so that a chip can be used regardless of existing defective memory cells. The yield is improved by substituting for portions of the defective cell array with a column or row from the redundancy memory cell array.

The redundancy method installs redundant memory cells to be substituted at connected positions adjacent to the chip's normal memory cell array. When the address of a defective cell is marked by blowing the metal or polysilicon fuses corresponding to the row (or column) of a defective cell in the normal memory cell array, the operation of the address decoder of a normal row (or column) is intercepted and the row (or column) of a substituted redundant cell is selected.

Generally, semiconductor memory cell constitution (such as in DRAM devices) consists of two states of data topology, corresponding to the arrangement and composition of the memory cell array. That is, one half of the memory cell array equals the output data's state to be read and written, while the other half corresponds to the complement data's state.

Similarly, since the redundant memory cell is constituted and installed as a part of a normal memory cell array in the periphery of a normal memory cell array, the data topology state of the row (or column) of each redundant memory cell can be fixed to one of the above two data topology states. When the defective normal memory cell array and the redundant memory cell array are substituted through a repair, one, two, four or eight rows or columns are substituted at the same time, and when such a block forms one or two redundant memory cell arrays or more, the redundant memory cell array substituted for the defective normal memory cell array is randomly substituted, and as a result, the data state of the substituted redundant cell may be different from the original data state.

Also, if a redundant memory cell which can be substituted according to the address of the cell to be repaired is fixed to match the data state, the efficiency of the redundant cell is reduced. And if the redundant memory cell is used regardless of the data state, the data states of redundant memory cell and the substituted normal memory cell are changed.

SUMMARY OF THE INVENTION

It is an object of the present invention to provide a circuit for improving the yield of a semiconductor memory device.

It is another object of the present invention to provide a circuit for making the data state of a substituted redundant memory cell equal to the data state of a normal memory cell, without reducing the efficiency of the redundant memory cells.

To achieve the objects, the semiconductor memory device of the present invention comprises:

a plurality of normal memory cell arrays having a first and a second data state;

a plurality of redundant memory cell arrays having a first and a second data states for substituting the normal memory cell arrays;

a plurality of input/output lines for transmitting input/output data to/from the memory cell arrays;

a plurality of complementary input/output lines for transmitting complementary input/output data to/from the memory cell arrays;

a plurality of first control signals for substituting a redundant memory cell array having the first data state for a defective normal memory cell array having the first data state; and a plurality of second control signals for substituting a redundant memory cell array having the second data state, for a defective normal memory cell array having the second data state, wherein a control circuit for transmitting the complementary input/output data to the plurality of input/output lines, and the input/output data to the plurality of complementary input/output data lines is provided according to the circumstances, i.e., when the defective normal memory cell array having the first data state is replaced with the redundant memory cell array having the second data state, or the defective normal memory cell array having the second data state is replaced with the redundant memory cell array having the first data state.

BRIEF DESCRIPTION OF THE DRAWINGS

The above objects and other advantages of the present invention will become more apparent by describing the preferred embodiment of the present invention with reference to the attached drawings, in which.

DETAILED DESCRIPTION OF THE INVENTION

First, a conventional redundancy circuit of a semiconductor device is explained to facilitate the understanding of the redundancy circuit of the present invention.

Figure 1:
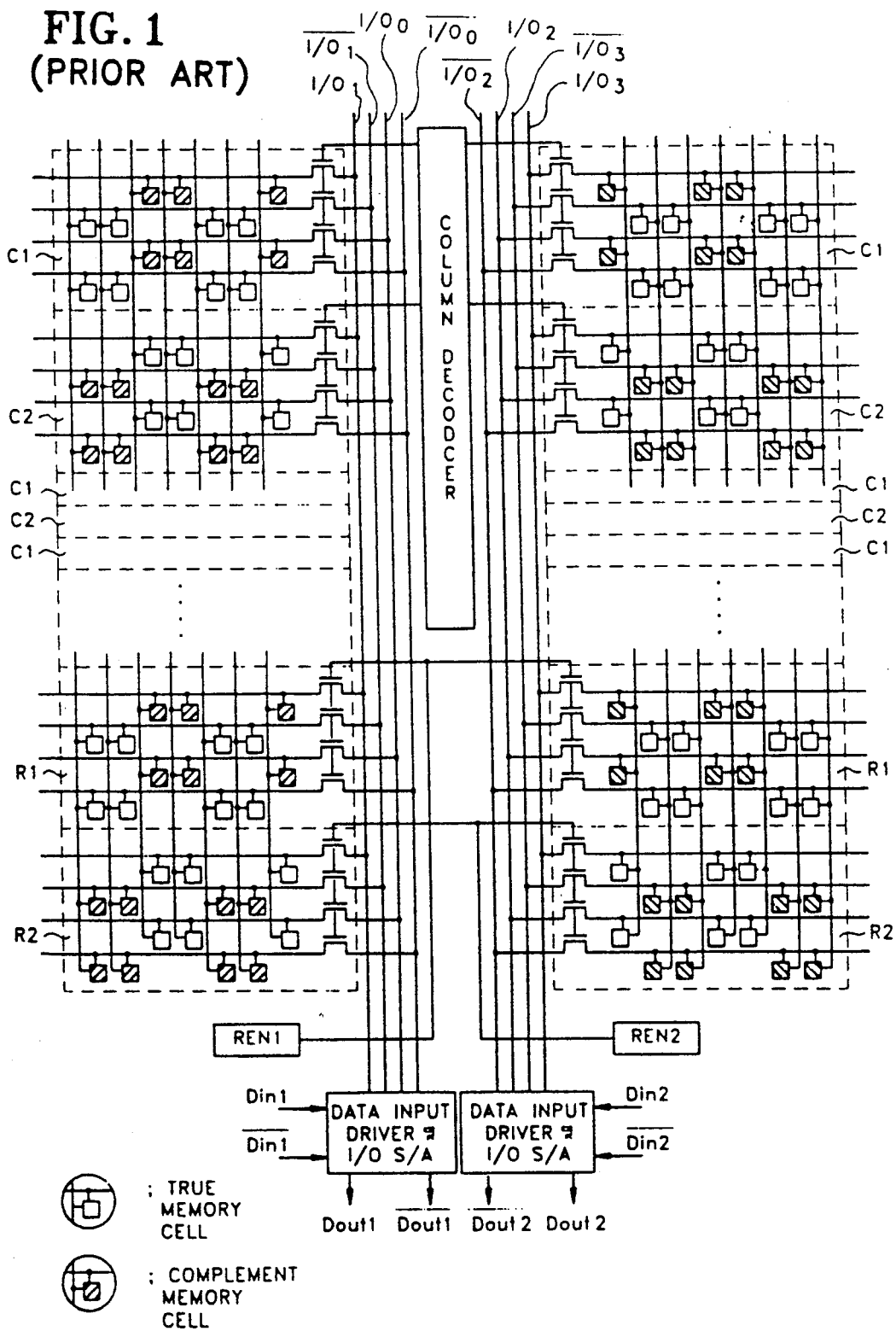
FIG. 1 shows a conventional circuit constitution for substituting for defective memory cells of a semiconductor device with a redundancy cell array.

FIG. 1 shows a conventional redundancy circuit of a semiconductor device, in which normal memory cells C1 and C2 having complementary data states are alternately located and redundant memory cells R1 and R2 are provided for substituting for defective normal cells C1 and C2. Each memory cell is bounded by a word line selected by a row address decoder and a bit line selected by a column address decoder. Each bit line is also connected to each input/output (I/O) line through an I/O gate in the form of an NMOS transistor driven by the column decoder. When an address of a defective normal memory cell C1 or a defective normal memory cell C2 is inputted, in order to replace the defective cell with a redundant memory cell R1 or a redundant memory cell R2, a redundant enable clock REN1 is supplied to I/O gates of redundant memory cell R1, and a redundant enable clock REN2 is supplied to I/O gates of redundant memory cell R2. If the normal memory cells C1 and C2 are not defective, the redundant memory cells R1 and R2 are left unused. If the normal memory cell C1 is defective, it is substituted for by the redundant memory cell R1, and if the normal memory cell C2 is defective, it is substituted for by the redundant memory cell R2. If two or more normal memory cells C1 (or two or more normal memory cells C2) are defective, it is possible to replace one normal memory cell C1 (or one normal memory cell C2) with one redundant memory cell R1 (or one redundant memory cell R2). However, the other normal memory cell C1 (or the other normal memory cell C2) must be replaced with the remaining redundant memory cell R2 (or the redundant memory cell R1). When this happens, the data state of the redundant memory cell R2 (or redundant memory cell R1) and the data state of the normal memory cell C1 (or a normal memory cell C2) are inverted with respect to each other. Accordingly, the data to be written or read out to/from the substituted redundant memory cell R2 (or the substituted redundant memory cell R1) are inverted with respect to the input/output data of the normal memory cell C1 (or C2).

Figure 2:
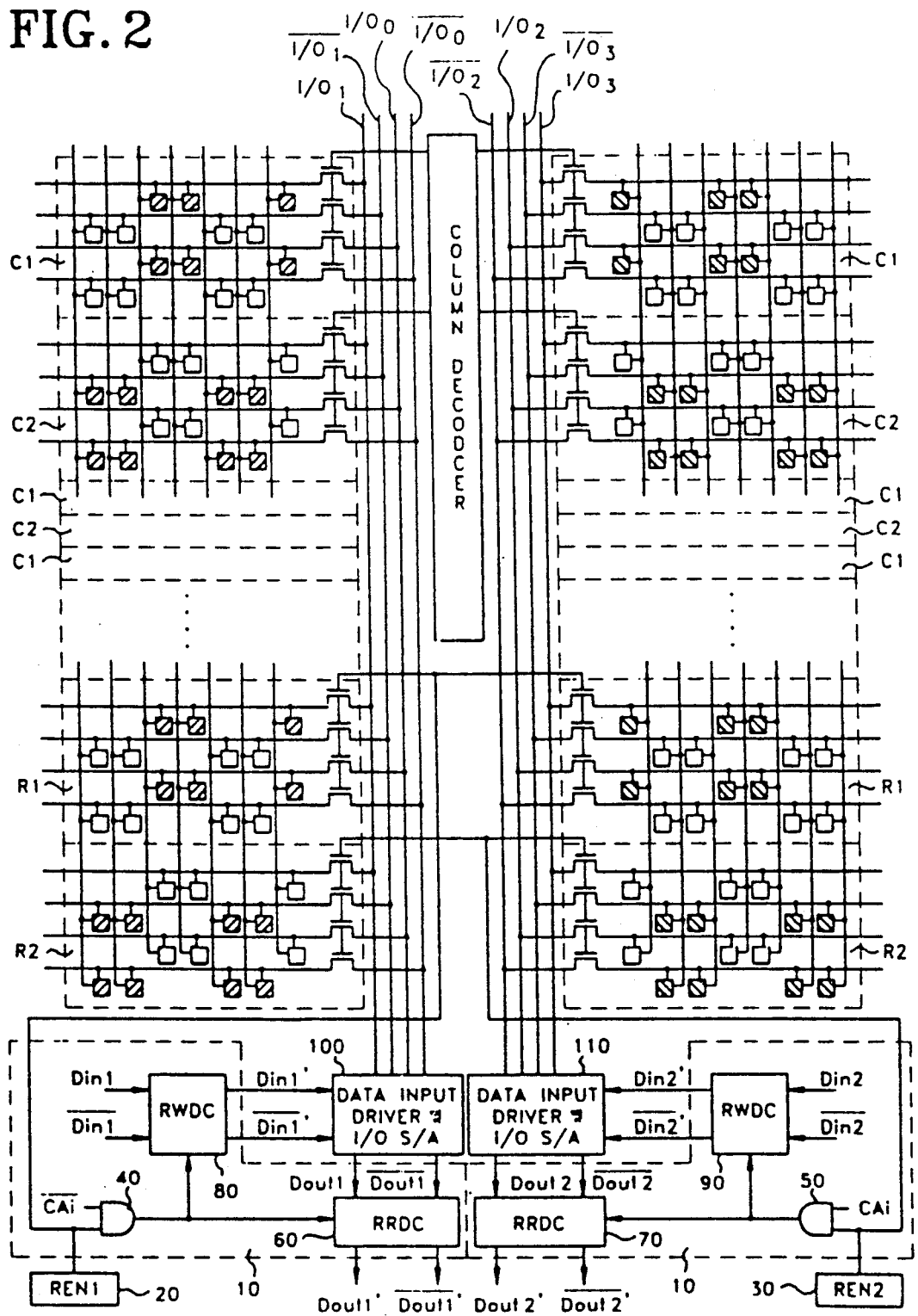
FIG. 2 shows an embodiment of a circuit constitution for substituting for defective memory cells of a semiconductor device with a redundancy cell array according to the present invention.

Contrary to the conventional semiconductor device shown in FIG. 1, the redundancy circuit of a semiconductor memory device according to the present invention as shown in FIG. 2 further comprises a pair of circuits 10 for changing the data states of the redundant memory cells as necessary in addition to the redundant enable clocks REN1 and REN2 for controlling I/O gates of the redundant memory cells R1 and R2. The circuits 10 are constituted as follows.

The data state of a normal memory cell can be determined before its replacement with a redundant cell by the use of a column address input signal CAi which can accordingly discriminate whether or not the data state of the substitute redundant memory cell matches that of the intended cell to be replaced. In the normal memory cell array, when a column address input signal CAi is at a low state, the data state of a normal memory cell C1 is selected, and when the column address input signal CAi is at a high state, the data state of a normal memory cell C2 is selected.

When the redundant enable signal from REN1 20 becomes high designating a redundant memory cell R1 to be substituted, if the column address input signal $\overline{CAi}$ is high, the redundant memory cell R1 is selected to match the data state of normal memory cell C1. In the reverse condition where column address input signal $\overline{CAi}$ is low, the data states change. In the complement circuit, when the redundant enable signal REN2 30 becomes high, stipulating replacement with a redundant memory cell R2, the same logic is performed on the column address input signal CAi.

AND gates 40 and 50 determine that when the respective redundant enable signal and column address input signal are high, the data state of the substitute cell will remain unchanged, and when the output of AND gate 40 or 50 is low, the data state will be inverted. Accordingly, the state of the I/O data to be read and written can be controlled using the AND-gated output of the respective redundant enable signal and column address input signal.

During read operations, the output of the AND gate 40 (or AND gate 50) connects a redundancy read data control (RRDC) circuit 60 (or RRDC 70) for controlling output data, to the data input driver and I/O sense amplifier output terminal 100 (or 110). During write operations, the output of the AND gate 40 (or AND gate 50) is connected to a redundancy write data control circuit (RWDC) 80 (or RWDC 90) for controlling input data, to the input terminal of the data input driver 100 (or 110) for driving the data input. Thus, the data of a redundant memory cell to be read or written can be controlled so as to match that of the normal memory cell.

Figure 3A:
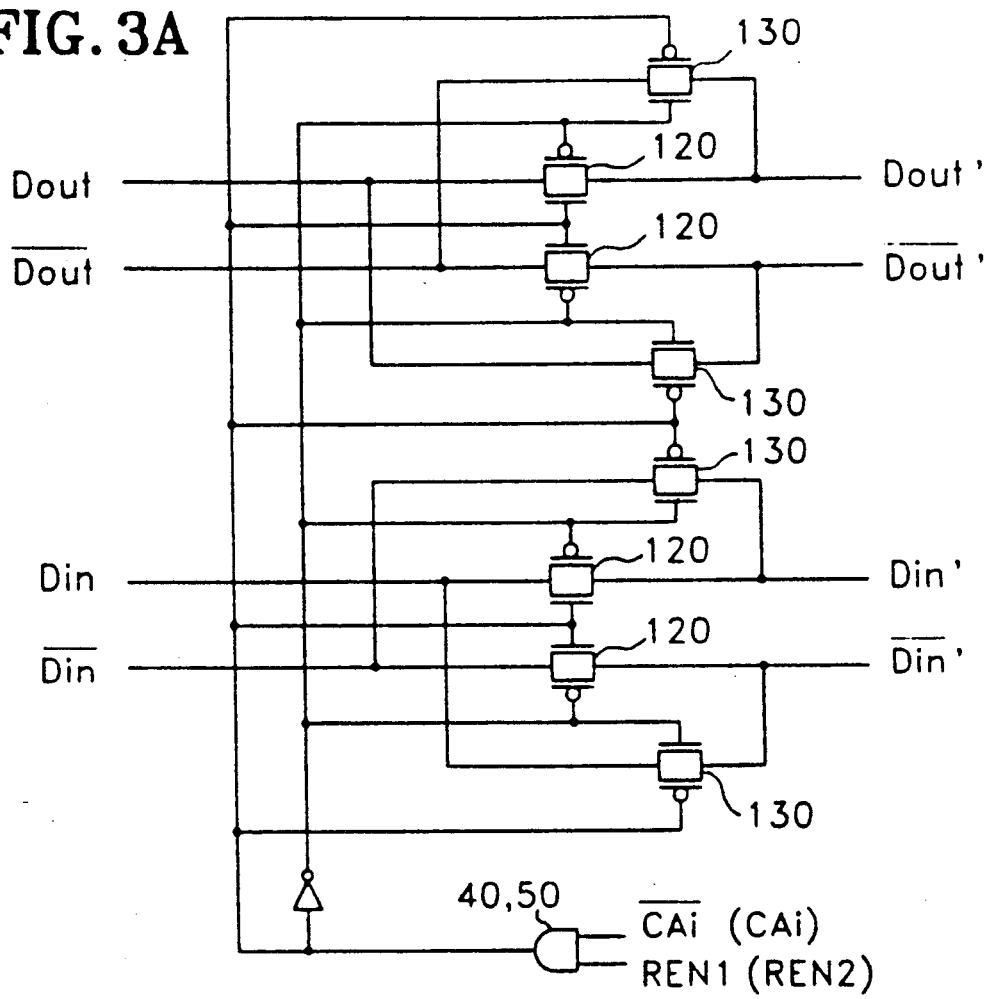
FIGS. 3A and 3B illustrate embodiments of a data control circuit during the read/write functions of the redundant cell arrays of FIG. 2.

FIG. 3A shows an embodiment of the circuits 10 of FIG. 2, whose operation will now be detailed.

In FIG. 3A, while the appropriate redundant enable clock REN1 (or REN2) and column address input signal $\overline{CAi}$ (or CAi) are both high, CMOS transmission gates 120 are turned on to directly transfer the signals supplied from the data input terminals $\overline{Din}$ and Din to data input terminals Din' and Din', respectively, and to directly transfer the signals supplied from the data output terminals $\overline{Dout}$ and Dout to the data output terminals Dout' and Dout', respectively. If a redundant enable clock REN1 (or REN2) is high while its corresponding column address input signal ($\overline{CAi}$ or CAi) is low, CMOS transmission gates 130 are turned on to transfer signals from data input terminals $\overline{Din}$ and Din and data output terminals $\overline{Dout}$ and Dout, to data input terminals Din' and Din' and data output terminals Dout' and Dout', respectively.

Figure 3B:
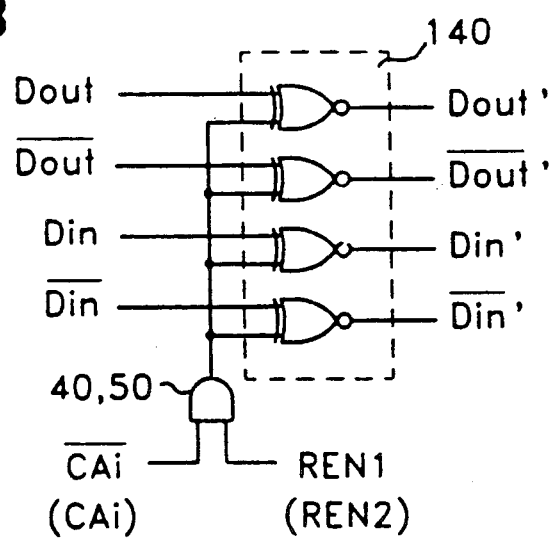

FIG. 3B shows another embodiment of the circuits 10 of FIG. 2, whose description is herein included.

Similarly, in FIG. 3B, if the applicable redundant enable clock REN1 (or REN2) and column address input signal $\overline{CAi}$ (or CAi) are both high, XNOR gates 140 will output data of the same state supplied from the data input terminals $\overline{Din}$ and Din and the data output terminals $\overline{Dout}$ and Dout to data input terminals Din' and Din' and data output terminals Dout' and Dout', respectively. When the corresponding column address input signal $\overline{CAi}$ (or CAi) goes low, the XNOR gates 140 invert the above signals, to provide the redundancy read/write data controllers with data of the proper topology.

That is, the circuits of FIGS. 3A and 3B show the same outputs for given input data conditions. However, the circuit constitution of FIG. 3A uses CMOS transmission gates which can minimize time delay and, due to a simpler constitution, will allow for a smaller chip than that of FIG. 3B.

Figure 4:
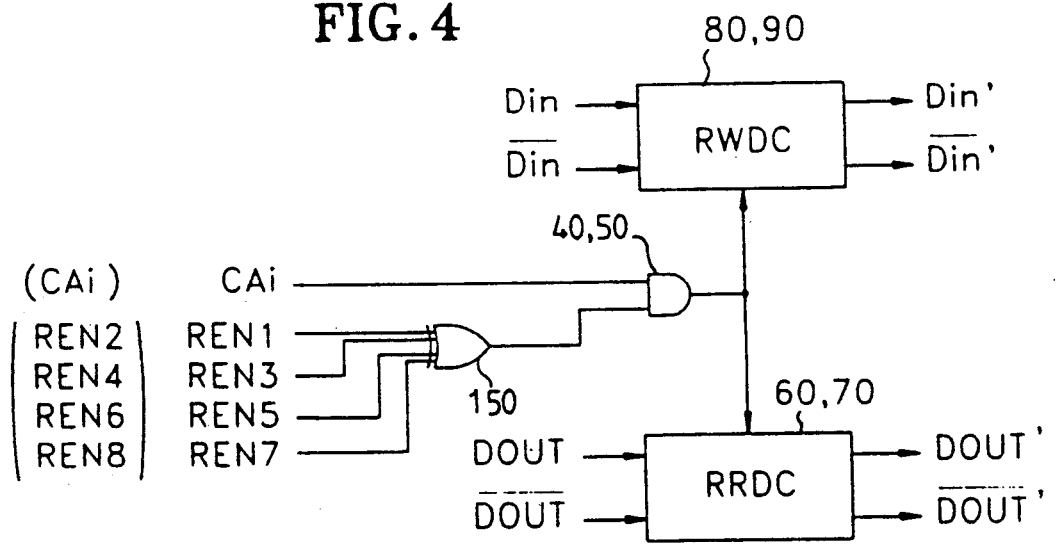
FIG. 4 illustrates another embodiment of a circuit according to the present invention for substituting redundancy cells for defective memory cells of a semiconductor memory device which is divided into several cell array blocks.

FIG. 4 is an embodiment of the circuits 10 of FIG. 2 for the case in which a memory array is divided into several cell array blocks. In order to drive redundant memory cells having common data-related cell constitution states, the output of OR gate 150 for OR-gating redundant enable clocks REN1, REN3, REN5, and REN7 having the same cell data constitution states (or, in the other circuit 10, REN2, REN4, REN6, and REN8) is connected to one input of AND gate 40 of FIG. 2. If any one of the redundant enable clocks is high, the output of OR gate 150 will be high, permitting the read/write data to be controlled according to the column address input $\overline{CAi}$ (or CAi).

Accordingly, it is possible for the semiconductor memory device of the present invention to raise its yield by making data to be read or written to/from the redundant memory cell be equal to those to/from the defective normal memory cell, even if the data state of defective normal memory cell is different from that of the substituted redundant memory cell.

What is claimed is:

1. A semiconductor memory device comprising:
   a plurality of normal memory cell arrays each having one of a first and a second data state;
   a plurality of redundant memory cell arrays each having one of a first and a second data state for substituting for defective normal memory cell arrays;
   a plurality of input/output lines for transmitting input/output data of said first data state to/from the memory cell arrays;
   a plurality of complementary input/output lines for transmitting complementary input/output data of said second data state to/from the memory cell arrays;
   a plurality of first control signals for substituting a redundant memory cell array having said first data state for a defective normal memory cell array having said first data state;
   a plurality of second control signals for substituting a redundant memory cell array having said second data state for a defective normal memory cell array having said second data state; and
   a control circuit for transmitting said complementary input/output data of said second data state to/from said plurality of input/output lines, and said input/output data of said first data state to/from said plurality of complementary input/output data lines when a defective normal memory cell array having said first data state is replaced with a redundant memory cell array having said second data state, and when a defective normal memory cell array having said second data state is replaced with said redundant memory cell array having said first data state.

2. A semiconductor memory device as claimed in claim 1, wherein said control circuit comprises:
   a first control circuit for controlling the input/output data of said redundant memory cell arrays having said first data state; and
   a second control circuit for controlling the input/output data of said redundant memory cell arrays having said second data state.

3. A semiconductor memory device as claimed in claim 2, wherein said first control circuit comprises:
   a first control gate for inputting a signal produced by OR-gating said first control signals, inputting an inverted address signal, and outputting a signal corresponding to a logical combination state of said inputted signals;
   first means for inversely transferring input data of said first data state and inverted input data of said first data state to said input/output lines in response to the output signal of said first control gate; and
   second means for inversely transferring output data of said first data state and inverted output data of said first data state to said input/output lines in response to the output signal of said first control gate.

4. A semiconductor memory device as claimed in claim 3, wherein said first control gate is an AND gate.

5. A semiconductor memory device as claimed in claim 2, wherein said second control circuit comprises:
   a second control gate for inputting a signal produced by OR-gating said second control signals, inputting an address signal, and outputting a signal corresponding to a logical combination state of said inputted signals;
   third means for inversely transferring input data of said second data state and inverted input data of said second data state to said complementary input lines in response to the output signal of said second control gate; and
   fourth means for inversely transferring output data of said second data state and inverted output data of said second data state to said complementary output lines in response to the output signal of said second control gate.

6. A semiconductor memory device as claimed in claim 5, wherein said second control gate is an AND gate.

7. A semiconductor memory device as claimed in claim 4, wherein said first means comprises:
   two first CMOS transmission gates, turned on in response to the output signal of said first control gate; and
   two second CMOS transmission gates, turned on in response to an inverted output signal of said first control gate,
   thereby transferring the input data as it is.

8. A semiconductor memory device as claimed in claim 6, wherein said second means comprises:
   two third CMOS transmission gates, turned on in response to the output signal of said first control gate; and
   two fourth CMOS transmission gates, turned on in response to the inverted output signal of said first control gate,
   thereby inverting the data before output.

9. A semiconductor memory device as claimed in claim 4, wherein said first means is composed of a first XNOR gate for receiving the output signal of said first control gate and said first data input signal and a second XNOR gate for receiving the output signal of said first control gate and said inverted first data input signal.

10. A semiconductor memory device as claimed in claim 7, wherein said second means is composed of a third XNOR gate for receiving the output signal of said first control gate and said first data output signal and a fourth XNOR gate for receiving the output signal of said first control gate and said inverted first data output signal.

11. A semiconductor memory device as claimed in claim 6, wherein said third means comprises:
   two fifth CMOS transmission gates, turned on in response to the output signal of said second control gate; and two sixth CMOS transmission gates, turned on in response to the inverted output signal of said second control gate, thereby transferring the input data as it is.

12. A semiconductor memory device as claimed in claim 9, wherein said fourth means comprises:

two seventh CMOS transmission gates, turned on in response to the output signal of said second control gate; and two eighth CMOS transmission gates, turned on in response to the inverted output signal of said second control gate, thereby transferring inverted data.

13. A semiconductor memory device as claimed in claim 5, wherein said third means is composed of a fifth XNOR gate for receiving the output signal of said second control gate and said second data input signal and a sixth XNOR gate for receiving the output signal of said second control gate and said inverted second data input signal.

14. A semiconductor memory device as claimed in claim 11, wherein said fourth means is composed of a seventh XNOR gate for receiving the output signal of said second control gate and said second data output signal and an eighth XNOR gate for receiving the output signal of said second control gate and said inverted second data output signal.

15. A semiconductor memory device, comprising:

a plurality of normal memory cell arrays, half of said normal memory cell arrays having a first data state, and the other half of said normal memory cell arrays having a second data state, said second data state being the complement of said first data state;

a plurality of redundant memory cell arrays, half of said redundant memory cell arrays having said first data state, and the other half of said redundant memory cell arrays having said second data state;

each of said normal memory cell arrays and said redundant memory cell arrays being composed of a plurality of memory cells, a first half of said memory cells having a data state corresponding to the data state of the array in which said memory cells are located, and the other half of said memory cells having an inverted data state which is the complement of the data state of said first half of said memory cells;

a plurality of input/output lines for transmitting input/output data and inverted input/output data of said first and second data states to/from the memory cell arrays;

a first control signal for substituting a redundant memory cell array having said first data state for a defective normal memory cell array;

a second control signal for substituting a redundant memory cell array having said second data state for a defective normal memory cell array; and a control circuit, responsive to said first and second control signals, for inversely transferring input/output data and inverted input/output data to/from said plurality of input/output lines when a redundant memory cell array having said first data state is substituted for a defective normal memory cell array having said second data state, and when a redundant memory cell array having said second data state is substituted for a defective normal memory cell array having said first data state.

16. A semiconductor memory device as claimed in claim 15, wherein said control circuit comprises:

a first logic gate coupled to receive said first control signal and an inverted memory cell array address signal and outputting a logic signal corresponding to a logical combination state of said first control signal and said inverted memory cell array address signal;

a second logic gate coupled to receive said second control signal and a noninverted memory cell array address signal and outputting a logic signal corresponding to a logical combination state of said second control signal and said noninverted memory cell array address signal;

means for inversely transferring input/output data and inverted input/output data having said first data state to/from said plurality of input/output lines in accordance with the output logic signal of said first logic gate; and means for inversely transferring input/output data and inverted input/output data having said second data state to/from said plurality of input/output lines in accordance with the output logic signal of said second logic gate.

* * * * *

UNITED STATES PATENT AND TRADEMARK OFFICE
CERTIFICATE OF CORRECTION

PATENT NO. : 5,218,572

DATED : June 8, 1993

INVENTOR(S) : Jeon-hyoung Lee

It is certified that error appears in the above-identified patent and that said Letters Patent is hereby corrected as shown below:

Title page, item [75], the 2nd inventor's town should be changed from "Suwon" to --Kyunggi--.

Col. 4, line 35, "Din'" should be --$\overline{Din'}$--.

Col. 4, line 38, "Dout'" should be --$\overline{Dout'}$--.

Col. 4, line 44, "Din'" should be --$\overline{Din'}$--.

Col. 4, line 45, "Dout'" should be --$\overline{Dout'}$--.

Col. 4, line 53, "Din'" should be --$\overline{Din'}$--.

Col. 4, line 54, "Dout'" should be --$\overline{Dout'}$--.

Col. 6, line 43, "6" should be --7--.

Col. 6, line 58, "7" should be --9--.

Col. 7, line 6, "9" should be --11--.

Col. 7, line 16, "5" should be --6--.

Col. 7, line 23, "11" should be --13--.

Signed and Sealed this

Fifth Day of April, 1994

Attest:

BRUCE LEHMAN

Attesting Officer

Commissioner of Patents and Trademarks